(12) United States Patent
Krivakapic et al.

(10) Patent No.: US 6,284,608 B1
(45) Date of Patent: Sep. 4, 2001

(54) METHOD FOR MAKING ACCUMULATION MODE N-CHANNEL SOI

(75) Inventors: Zoran Krivakapic, Santa Clara; Srinath Krishnan, Campbell; Witold Maszara, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/496,245

(22) Filed: Feb. 1, 2000

(51) Int. Cl.[7] .................................................. H01L 21/336
(52) U.S. Cl. ........................... 438/286; 438/257; 438/264
(58) Field of Search ..................................... 438/286, 257, 438/264, 298, 774; 257/621, 773, 903, 316, 301, 302, 303, 304, 305, 314

(56) References Cited

U.S. PATENT DOCUMENTS

| | | | |
|---|---|---|---|
| 5,330,925 | * 7/1994 | Lee et al. | 437/44 |
| 5,434,093 | * 7/1995 | Chan et al. | 437/41 |
| 5,721,146 | * 2/1998 | Llaw et al. | 437/26 |
| 5,960,291 | * 9/1999 | Krivokapic | 438/286 |
| 5,986,328 | * 11/1999 | Liaw | 257/621 |
| 6,147,378 | * 11/2000 | Liu et al. | 257/316 |

FOREIGN PATENT DOCUMENTS 10-163123 * 6/1998 (JP) ........................................ 21/265

* cited by examiner

*Primary Examiner*—Tuan H. Nguyen
*Assistant Examiner*—Laura M Schillinger
(74) *Attorney, Agent, or Firm*—Skjerven Morrill MacPherson LLP; Edward C. Kwok, Esq.

(57) ABSTRACT

A method of manufacturing an accumulation mode n-channel Silicon On Insulator (SOI) transistor includes forming an intrinsic silicon body region implanted with two deep Boron and one shallow Phosphorous implants; forming source/drain regions each implanted with Arsenic; and forming p-type regions adjacent each of the source and drain regions and disposed along the transistor channel. The SOI transistor has a higher transconductance than known SOI devices.

5 Claims, 6 Drawing Sheets

METHOD FOR MAKING ACCUMULATION MODE N-CHANNEL SOI

FIELD OF THE INVENTION

The present invention relates to semiconductor devices and more particularly to semiconductor on insulator devices.

BACKGROUND OF THE INVENTION

Integrated Circuits (IC) containing Semiconductor On Insulator (SOI) devices are becoming increasingly important due to their speed. An SOI device (i.e., transistor) is typically formed in a layer of semiconductor material overlaying an insulating layer formed in a semiconductor substrate.

A prior art SOI transistor includes a source region and a drain region which are separated from each other by a channel region. Both the source and drain regions are of the same conductivity type and are of opposite conductivity type to that of the body region. For example, when the body region is of a p-type material, the source and drain regions are of an n-type material. The source and drain regions typically have a higher dopant concentration level than the body region.

The transconductance of currently known SOI devices decreases as the supply voltage decreases. Therefore, a need exits for an SOI device which exhibits higher transconductance than SOI devices known in the prior art at low supply voltages.

SUMMARY OF THE INVENTION

An accumulation mode n-channel Silicon On Insulator (SOI) transistor, in accordance with one embodiment of the present invention, includes: an intrinsic silicon body region which contains two deep Boron and one shallow Phosphorous implants; source/drain regions each including Arsenic implant; p-type regions adjacent each of the source and drain regions, and disposed along the channel.

The following processing steps are carried out to make the SOI device, in accordance with one embodiment of the present invention. After forming a shallow trench isolation, the top silicon layer receives deep Boron and shallow Phosphorous implants through a thin layer of an insulating material (e.g., oxide). Thereafter, gate oxide is grown, polysilicon gate is formed and a zero-tilt Arsenic implant is made to form the source/drain regions of the device. After a rapid thermal anneal, a tilted channel implant delivers BF2 impurities through an insulating layer (e.g., oxide liner) to the channel, thus creating p-type regions adjacent each of the source and drain regions. Thereafter, a shallow phosphorous implant is delivered to the channel and through oxide spacers formed adjacent the polysilicon gate to form n-type regions near each of the source and drain regions. A deep Boron implant is then performed to prevent punch-through. Next, a pair of second oxide spacers are formed adjacent the first oxide spacers and the wafer is subsequently salicided using a conventional salicidation process.

DETAILED DESCRIPTION

Figure 1:
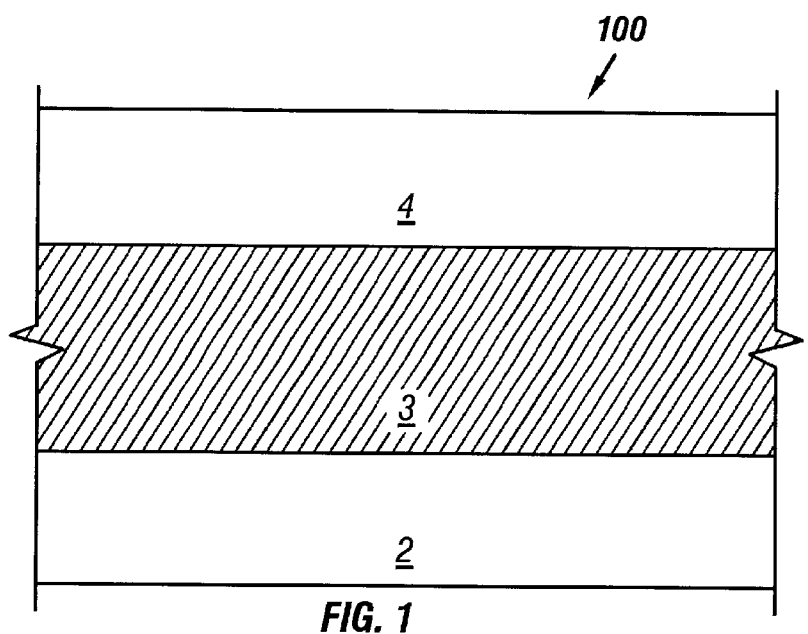
FIG. 1 is a cross-sectional view of the various layers of a silicon-on-insulator (SOI) wafer, used to make an accumulation mode n-Channel SOI device, in accordance with one embodiment of the present invention.

FIG. 1 shows the three layers 2, 3 and 4 of silicon-on-insulator (SOI) wafer 100. Layer 2 is a p-type silicon substrate. Layer 3 is a silicon dioxide layer and has a thickness of approximately 2000 angstroms. Layer 4 is intrinsic silicon layer and has a thickness of approximately 1000 to 1200 angstroms. Wafer 100 is commercially available from a number of manufacturers.

Figure 2:
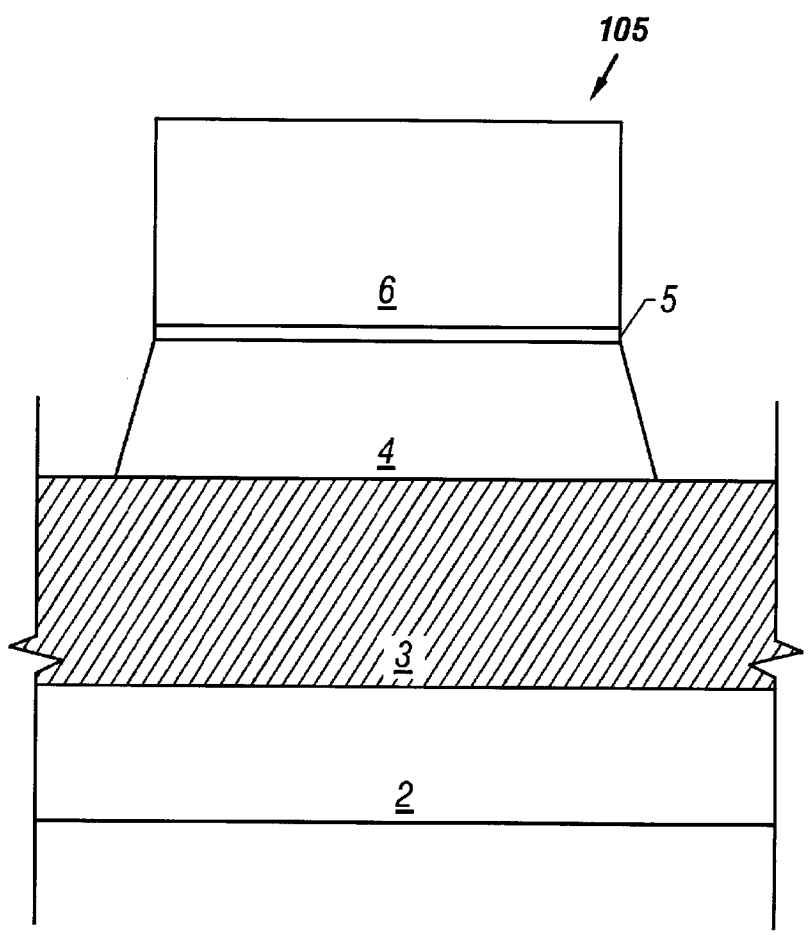
FIG. 2 is a cross-sectional view of the SOI wafer of FIG. 1, after the top silicon layer of the SOI wafer has been etched following oxidation and nitride deposition steps to create trench isolation.

The first step in making an n-channel enhancement mode device in one embodiment of the present invention is to make a trench isolation. To make a trench isolation (see FIG. 2), a silicon dioxide layer 5 with a thickness of, for example, 90 angstrom is grown over the surface of silicon layer 4. Next, a silicon nitride layer 6 with a thickness of, for example, 1800 angstrom is deposited over oxide layer 5. Thereafter, wafer 100 is masked and patterned using conventional masking and etching steps such that layer 4 is etched in all regions except in the areas approximately underneath layers 5 and 6, thereby forming structure 105 as shown in FIG. 2.

Figure 3:
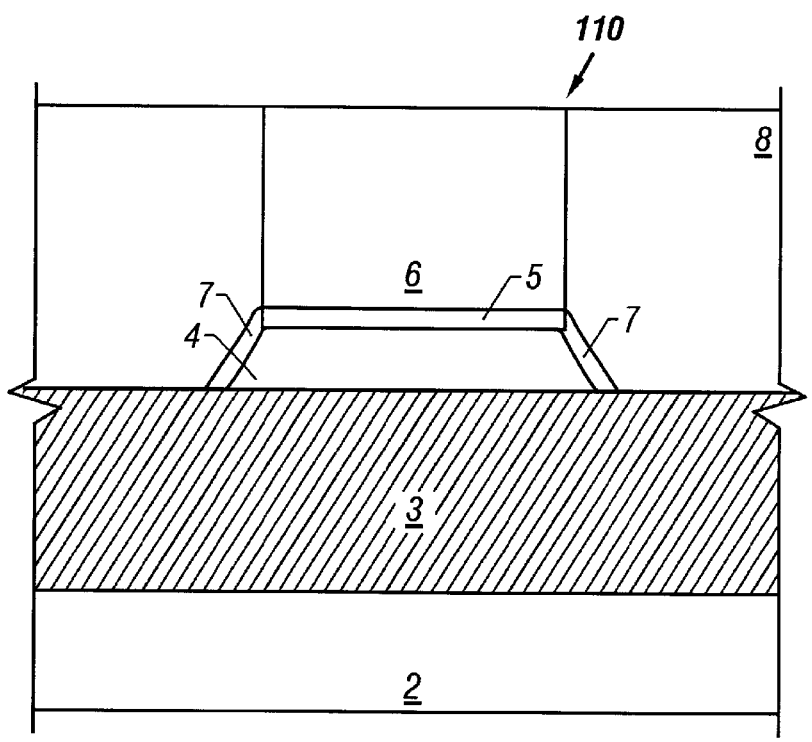
FIG. 3 is a cross-sectional view of the SOI wafer of FIG. 2, following formation of oxide liners, deposition of plasma TEOS and polishing the resulting structure down to the top surface of the nitride layer.

Thereafter, as shown in FIG. 3, using a high temperature dry oxidation process (e.g. 1100° C.), an oxide liner 7, which typically has a thickness of 150 angstrom is grown. Oxide liner 7 reduces dislocation defects occurring near the surface of layer 4. Thereafter, plasma TEOS 8 (Tetra Ethyl Ortho Silicate) layer 8 having a thickness of 5000–6000 angstrom is deposited across the entire wafer. Next, wafer 100 is polished down to the top surface of silicon nitride layer 6, thereby, forming structure 110, as shown in FIG. 3.

Figure 4:
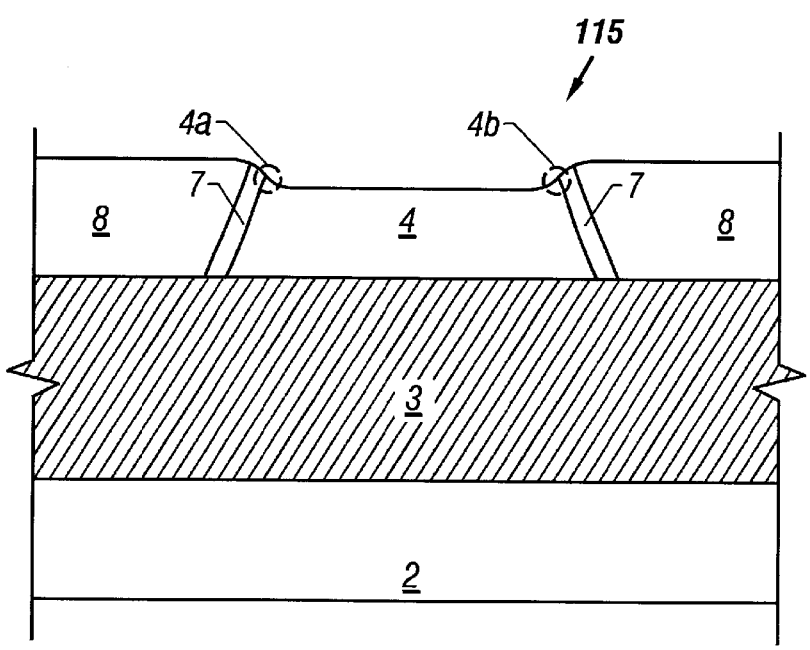
FIG. 4 is a cross-sectional view of the SOI wafer of FIG. 3, after removal of the oxide and nitride layers.

Next, nitride layer 6 and oxide layer 5 are removed. As seen from the resulting structure 115 of FIG. 4, silicon layer 4 contains sharp corners inside perimeter lines 4_a and 4_b.

To taper and thereby reduce the electric field near the sharp corners 4_a and 4_b, a layer of sacrificial oxide 9

Figure 5:
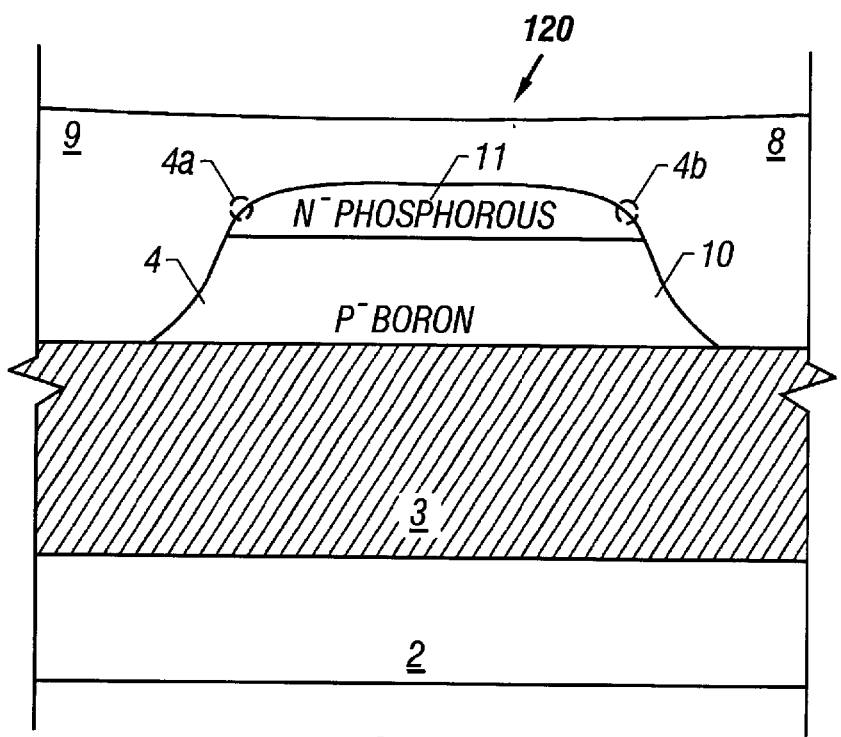
FIG. 5 is a cross-sectional view of the SOI wafer of FIG. 4, after growing sacrificial oxide and carrying out deep Boron and shallow Phosphorous implants.

(typically less than 100 angstrom) is grown on top of the wafer (see FIG. 5). Thereafter, silicon layer 4 is subjected to a deep Boron implant (with a typical Boron concentration of $10^{17}$ to $2\times10^{17}$ cm$^{-3}$) through the sacrificial oxide layer 9, thereby, forming p$^-$ region 10 inside silicon layer 4. Next, layer 4 receives a shallow Phosphorous implant to form n$^-$ region 11 near the surface of silicon layer 4 to thereby form structure 120, as shown in FIG. 5. The energy used to implant Phosphorous is typically around 5 to 10 kilo-electron volts (Kev). The Phosphorous dose is typically between $2.5\times10^{12}$ to $7.5\times10^{12}$ cm$^{-2}$, which is high enough to convert region 11 from p to n$^-$ conductivity type.

Figure 6:
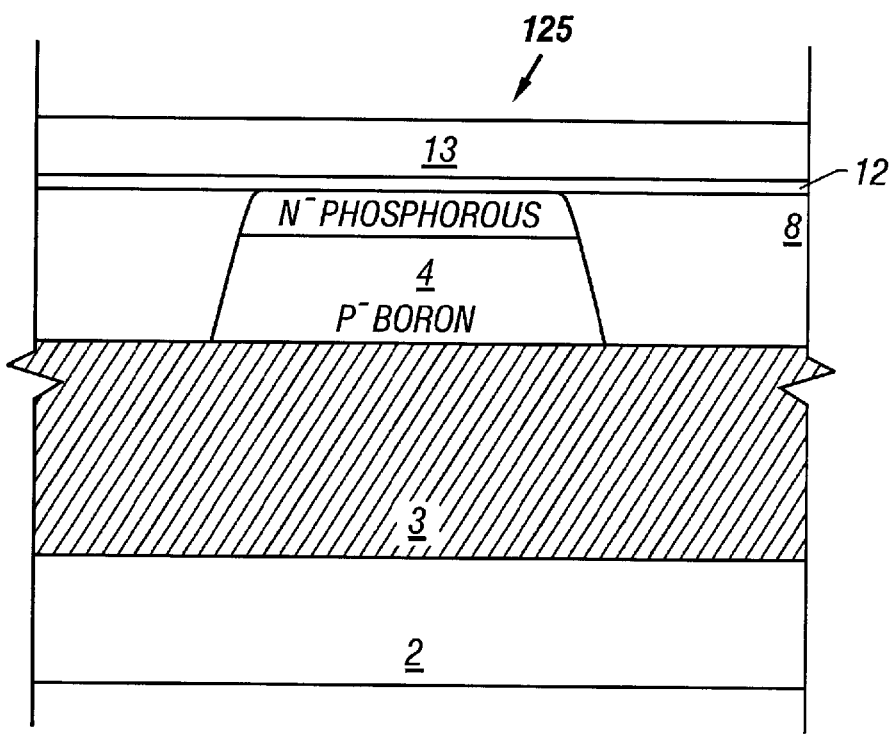
FIG. 6 is a cross-sectional view of the SOI wafer of FIG. 5, after removing the sacrificial oxide, growing gate oxide and depositing polysilicon.

Next, as shown in FIG. 6, sacrificial oxide 9 is removed, and gate oxide 12 (with a thickness of e.g. 10–20 Å) is grown. During the gate oxidation process the implanted Phosphorous atoms advantageously move closer to the silicon surface. Thereafter, polysilicon layer 13 is deposited over the wafer, thereby forming structure 125, shown in FIG. 6. Polysilicon layer 13 has a typical thickness of, for example, between 1200 to 1700 Å.

Figure 7:
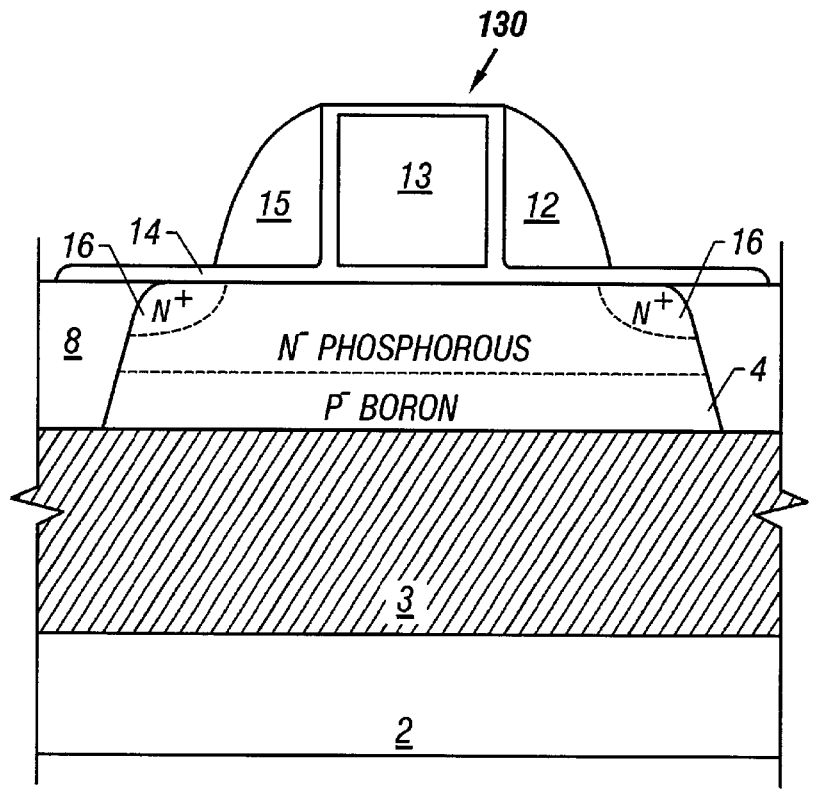
FIG. 7 is a cross-sectional view of the SOI wafer of FIG. 6, after forming the polysilicon gate and forming oxide liners, nitride spacers, and source/drain regions.

Next, as shown in FIG. 7, using conventional masking and etching steps, polysilicon gate 13, oxide liner 14 and nitride spacer 15 are formed. Subsequently, wafer 100 receives an Arsenic implant to form n$^+$ source/drain regions 16, thereby forming structure 130, as shown in FIG. 7. The arsenic implant is performed at zero tilt and has an energy of 10–30 Kev and a dose of $3$–$5\times10^{-15}$ cm$^{-2}$. Thereafter, the wafer is annealed using a rapid thermal annealing process at a temperature of approximately 1030–1060 degrees centigrade for a period of approximately 5–10 seconds. The anneal process activates the implanted Arsenic atoms and causes the junction between source/drain regions 16 and silicon layer 4 to move deeper into silicon layer 4.

Figure 8:
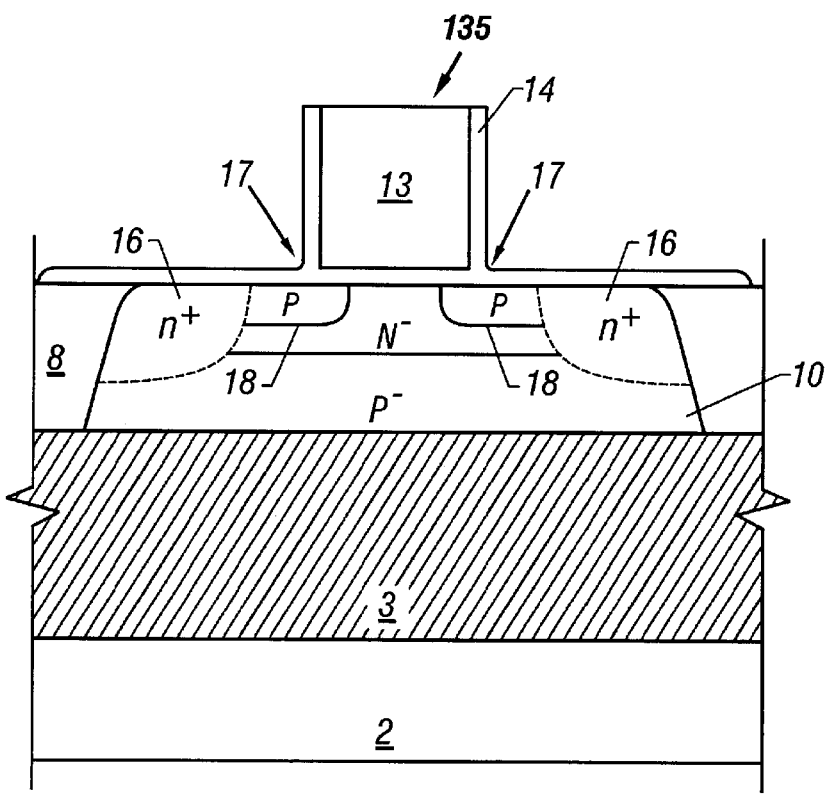
FIG. 8 is a cross-sectional view of the SOI wafer of FIG. 7, after removing the nitride spacers and performing tilted channel implants to create p-type regions near each of the source and drain regions.

After the anneal process, nitride spacer 15 is removed by placing wafer 100 in hot Phosphoric acid. Next, as shown in FIG. 8, a tilted channel implant (TCI) is performed to implant silicon layer 4 with BF2 (Boron-Fluoride) as indicated by arrows 17. A typical energy, total dose and the tilt angle of the TCI are respectively, 30–50 Kev, $4$–$6\times10^{13}$ CM$^{-2}$ and 7–20°. The BF2 dose of $4$–$6\times10^{13}$ cm$^{-2}$ is delivered during four tilt rotations. The TCI forms p region 18 in n$^-$ region 11 of silicon layer 4, thereby forming structure 135, as shown in FIG. 8. P regions 18 each have a dopant concentration that is approximately four times greater than that of p$^-$ region 10.

Figure 9:
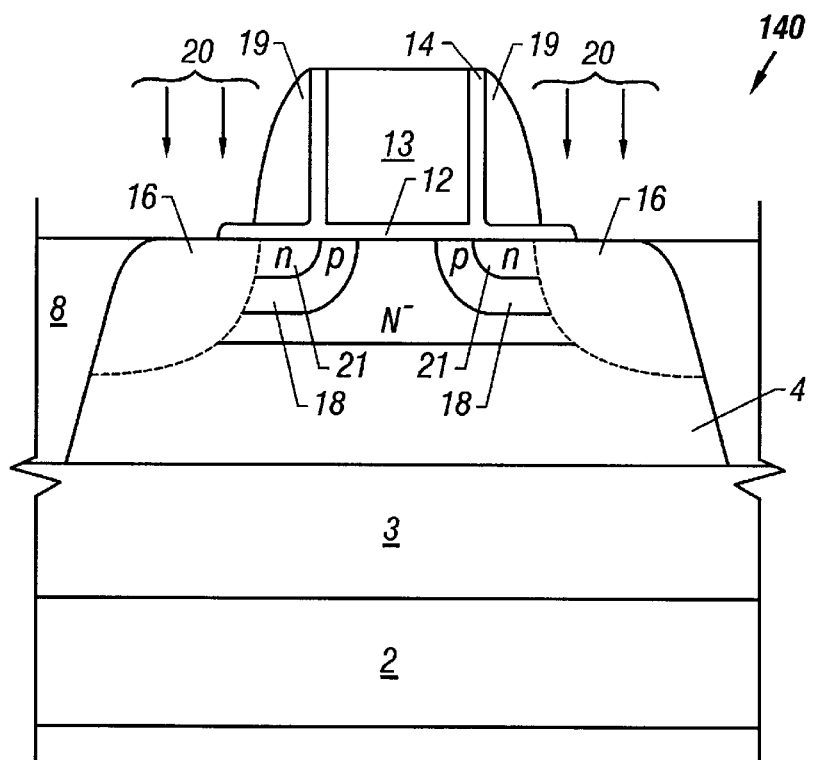
FIG. 9 is a cross-sectional view of the SOI wafer of FIG. 8, after forming oxide spacers and performing a shallow Phosphorous implant.

Next, as seen in FIG. 9, using conventional processing steps, oxide spacers 19 which are typically 100 to 200 angstroms wide are formed. Thereafter, a shallow zero-tilt Phosphorous implant is made as indicated by arrows 20. A typical energy, and dose of the shallow Phosphorous implant are, 3–7 Kev and $5\times10^{14}$ to $1.2\times10^{15}$ CM$^{-2}$, respectively. The shallow Phosphorous implant allow n$^+$ regions 16 to extend under the gate oxide 12 by forming shallow n regions 21 near the surface of silicon layer 4. The resulting structure 140 is shown in FIG. 9.

Figure 10:
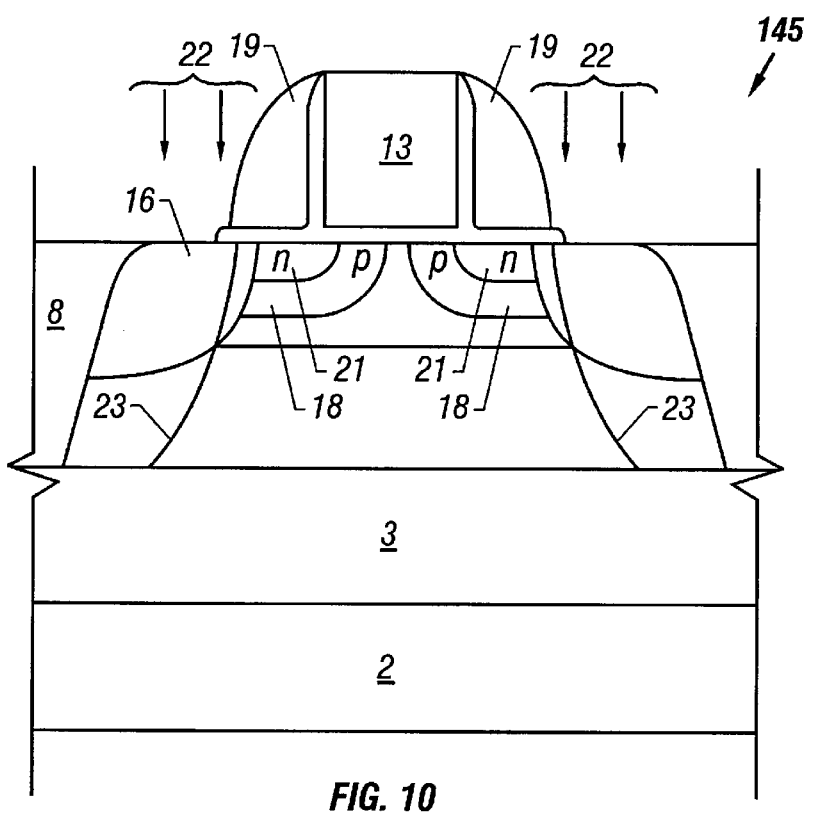
FIG. 10 is a cross-sectional view of the SOI wafer of FIG. 9, after performing a deep Boron implant.

Next, as seen in FIG. 10, a deep Boron implant is carried out as indicated by arrows 22 (e.g. 0 to 15° tilt angle) to prevent punch-through. The deep Boron implant has an energy of 25–35 Kev and a total dose of $5\times10^{12}$ to $1\times10^{13}$. Next an RTA is performed for a period of 2–5 seconds at a temperature of 990–1010° C. The boundaries 23 of the deep Boron implant—following the anneal process—are shown in structure 145 of FIG. 10.

Figure 11:
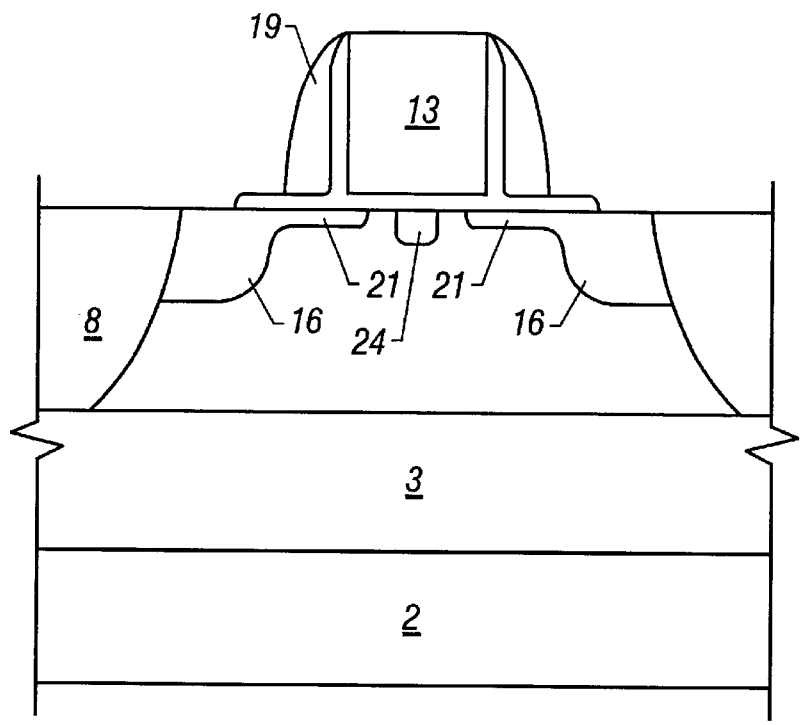
FIG. 11 shows the various regions of the SOI wafer of FIG. 10 having n-type impurities.

FIG. 11, shows the various regions having n-type impurities in silicon layer 4. Regions 16 have a relatively very high n-type doping concentration. Regions 21 have an n-type doping concentration that is smaller than those of regions 16 but larger than that of region 21. Region 24 is lightly doped with n-type dopants.

Figure 12:
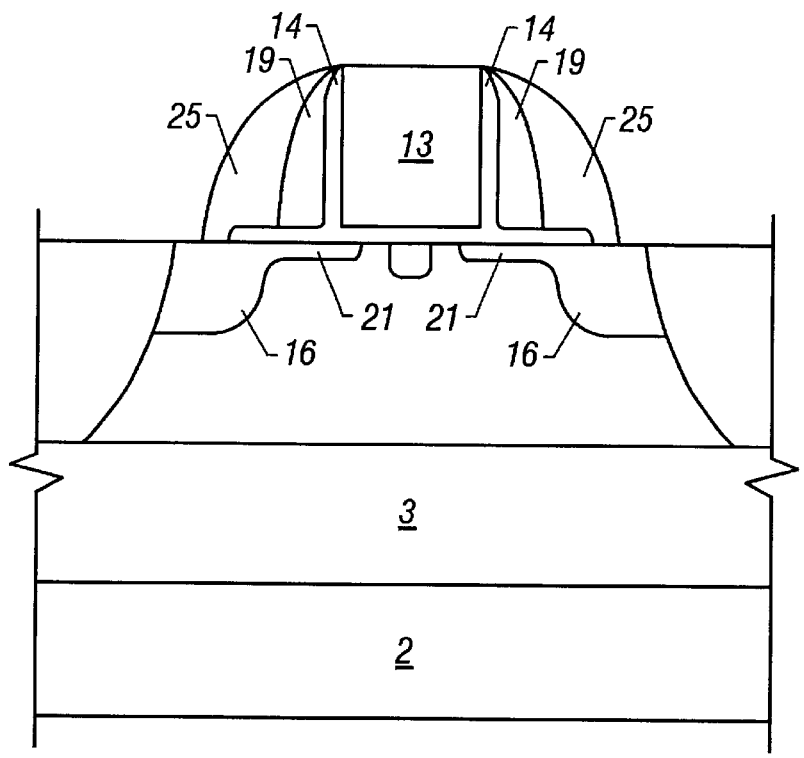
FIG. 12 is a cross-sectional view of the SOI wafer of FIG. 10 after forming oxide spacers adjacent existing oxide spacers.

Next, as shown in FIG. 12, oxide spacer 25 are formed using conventional processing steps. Thereafter, salicides are selectively formed on the surface of wafer 100.

The exemplary embodiments of the invention disclosed above are illustrative and not limiting. Other embodiments of this invention are possible within the scope of the appended claims.

What is claimed is:

1. A method of making an n-channel Silicon on Insulator (SOI) transistor comprising:

making a trench isolation thus defining the body region of the transistor;

delivering a deep p-type and a shallow n-type implant to the body region through an insulating layer formed over the body region;

forming a gate over the body region and separated therefrom by a gate oxide;

forming spacers and liners over the body region and adjacent said gate;

implanting the body region with n-type dopants to form source and drain regions separated from each other by a channel;

removing the spacer and performing a tilted channel implant to form p-type regions adjacent each of the source and drain regions and disposed along the channel;

delivering a shallow p-type implant after removing the spacers; and delivering a deep p-type implant.

2. The method of claim 1 wherein the making of trench isolation comprises:

growing an oxide layer over the silicon layer;

depositing a nitride layer over the oxide layer;

patterning the nitride and the oxide layer to etch the underlying silicon region so as to define the transistor body region;

deposition a layer of TEOS;

polishing the layer of TEOS; and removing the oxide and the nitride layers.

3. The method of claim 2 further comprising growing a layer of sacrificial oxide after removing the oxide and nitride layers.

4. The method of claim 3 wherein the act of delivering a deep p-type implant and a shallow n-type implant includes delivering a deep Boron implant and a shallow Phosphorous implants, respectively.

5. The method of claim 4 further comprising rapid thermal annealing after forming the source and drain regions.

* * * * *